United States Patent [19]
Clayton et al.

[11] Patent Number: 6,064,195
[45] Date of Patent: May 16, 2000

[54] TEST PROBE POSITIONING DEVICE

[75] Inventors: Gary A. Clayton, Boise; Douglas G. Hastings, Meridian, both of Id.

[73] Assignee: R-Tec Corporation, Meridian, Id.

[21] Appl. No.: 09/076,314

[22] Filed: May 11, 1998

[51] Int. Cl.⁷ .......................... G01R 31/02; H01R 39/02
[52] U.S. Cl. ......................... 324/158.1; 324/758; 439/8
[58] Field of Search ................. 324/158.1, 758, 324/73.1, 761, 754, 72.5; 439/8, 9, 6

[56] References Cited

U.S. PATENT DOCUMENTS

| | | | |
|---|---|---|---|
| 3,731,191 | 5/1973 | Bullard et al. | 324/158 F |
| 3,906,363 | 9/1975 | Fowler | 324/158 F |
| 4,460,236 | 7/1984 | Strautz | 339/176 M |
| 4,554,506 | 11/1985 | Faure et al. | 324/158 P |
| 4,746,297 | 5/1988 | Soleau | 439/8 |
| 4,834,658 | 5/1989 | Kotani et al. | 439/8 |
| 4,846,702 | 7/1989 | Ignasiak et al. | 439/71 |
| 4,952,872 | 8/1990 | Driller et al. | 324/158 F |
| 4,978,912 | 12/1990 | Vonder et al. | 324/158 P |
| 5,122,070 | 6/1992 | Lebris et al. | 439/140 |
| 5,436,570 | 7/1995 | Tan | 324/761 |
| 5,635,849 | 6/1997 | Lo et al. | 324/758 |
| 5,642,056 | 6/1997 | Nakajima et al. | 324/758 |
| 5,811,981 | 9/1998 | Tan | 324/758 |

*Primary Examiner*—Josie Ballato
*Assistant Examiner*—Minh Tang
*Attorney, Agent, or Firm*—Robert L. Shaver

[57] ABSTRACT

An alignment system for positioning a socket test probe in a socket of a printed circuit board to be tested. The socket test probe is self-aligning in the socket by use of a free-floating ball joint enclosed in a ball joint housing. The socket test probe is connected through a probe body to the ball joint, and is held in an immobilized position until it is ready to enter a socket. When entering a socket, the probe body is free floating about the ball joint, and the socket test probe aligns itself for entry into the socket by friction between the socket and the socket test probe. A clamp on the probe body immobilizes or frees the probe body with its attached socket test probe. The clamp is activated by air pressure.

9 Claims, 9 Drawing Sheets

TEST PROBE POSITIONING DEVICE

BACKGROUND OF THE INVENTION

1. Field of the Invention

The present invention generally relates to an apparatus for testing electrical sockets with a test probe, and more specifically, to systems for aligning the test probe for insertion into the socket.

2. Background Information

Electrical sockets, such as those used for the insertion of semi-conductor chips, are tested during the manufacturing process to verify their functioning and connection properties. The sockets are tested by the insertion of a test probe which has a head which is shaped approximately in the same dimensions as the semi-conductor chip which will go in that socket. Electrodes are arranged along the sides of the test probe head in the same spacing and configuration as the electrodes of the semi-conductor chip. By contacting the electrodes of the socket, the electrodes of the test probe head can make electrical contact and allow tests to be run on the socket.

The semi-conductor sockets are typically arranged on a printed circuit board (PCB) and are tested by placing the board on an X-Y test bed. The testing system with a test probe head attached moves to align with each socket to be tested. When the socket is in position, the test probe head is lowered toward the socket, and pressed into place in the socket.

A problem is that the sockets on a PCB are not always accurately positioned. They may be rotated from alignment with the X and Y axis of the PCB, displaced along the X or Y axis, or both, or they may be tilted from the plane of the PCB. Since the tolerances between the socket and the semi-conductor chip, and therefore the test probe head, are very small, these small discrepancies in position can be a problem. Pressing the test probe head into a misaligned socket can damage the terminals in the socket, can cause excessive wear on the test probe head, and can lead to shortened life of both, as well as inaccurate test results.

Various systems have been utilized to compensate for this discrepancy in position of the socket. These include the use of a suction cup for attachment between the socket and the test probe head, a camera guided alignment system, and other systems. The camera guided alignment system uses a camera to determine the position and alignment of the socket, and guides the test probe head into accurate insertion in the socket. This kind of system is complicated and expensive, and therefore a less complicated, simpler and more reliable and cheaper system is needed.

Accordingly, it is an object of the invention to provide a system for aligning a socket test probe for insertion into a socket which can be misaligned from its placement on a PCB.

It is a further object of the invention that such a test probe apparatus be simple, and yet accommodate a variety of misalignments of socket positions from the intended position on the PCB.

A further object of this system is to provide a socket test probe alignment system which reduces wear on both the socket test probe and the socket, and results in an improved life span of both the socket test probe and the socket.

It is a further object of the invention to provide an alignment system for socket test probes which gives accurate tests of the sockets electrical connections and circuitry.

Additional objects, advantages and novel features of the invention will be set forth in part in the description as follows, and in part will become apparent to those skilled in the art upon examination of the following, or may be learned by practice of the invention. The objects and advantages of the invention may be realized and attained by means of the instrumentalities and combinations particularly pointed out in the appended claims.

SUMMARY OF THE INVENTION

According to the present invention, the foregoing and other objects and advantages are attained by a free floating socket test probe alignment system. The purpose of this alignment system is to insert a socket test probe into an electrical socket, such as a socket for receiving a semi-conductor chip on a printed circuit board (PCB), for making electrical connection with the socket in the same manner that the semi-conductor chip would make contact with the socket, and performing tests on the socket. This alignment system includes a socket test probe. The socket test probe is attached to a positioning device body, and when aligned with the socket to be tested, is inserted into the socket, thereby establishing electrical and physical connection with the electrodes of the socket. The socket test probe has electrodes which are configured to match the number, spacing, size, and shape of the electrodes in the socket. Between the socket test probe and the positioning device body is a probe interface. The probe interface physically and electrically connects the socket test probe to the socket test probe holder, which is part of the positioning system body. Because of the probe interface, socket test probes of the alignment system are replaceable and interchangeable. Thus, a socket test probe can be changed to match a different configuration of socket, or to replace a socket test probe which shows wear. The alignment system also includes electrical connections which connect the probe interface to a testing system. The testing system would typically be a computer which runs diagnostic tests on the socket using a diagnostic program. The probe interface and the socket test probe holder are part of a positioning device body. The positioning device body is typically a tubular structure, square or circular in cross-section. The positioning system body has two ends, and at the end opposite the location of the probe interface and the socket test probe holder, the positioning device body is attached to a ball joint. The ball joint is spherical in shape, and is suspended and contained within a ball joint housing. The ball joint housing is adjustable and gives the ball joint a limited freedom of movement. The amount of freedom of movement the ball joint housing gives the ball joint can be selected by the user. The alignment system also includes a clamp which grips the positioning system body and either immobilizes it when gripping, or allows it to move freely when the clamp is released. When the clamp immobilizes the positioning system body by gripping it, it moves the positioning system body into a neutral position, a position from which the alignment system can move to and approach the next socket to be tested. A motorized arm may be included which moves the positioning system body in an up and down or Z-direction in relation to the socket. A variation of the above alignment system is a system in which the ball joint housing is made of multiple sections.

The multiple sections join together and partially surround the ball joint. The freedom of movement given the ball joint depends upon the proximity of each of the sections of the ball joint housing to the other sections. The multiple sections can be an upper piece, which covers the top half of the spherical shaped ball joint, and two lower pieces which each form a quarter of a lower half. The three pieces together form a ball joint housing which is roughly cubicle in outside shape, and which encloses a spherical cavity in which the ball joint is located.

The system described above can be configured so that the electrical connections pass through the system body and the ball joint, and continue on to a testing system, such as a computer. The system described above can also be configured so that the clamp is activated and deactivated pneumatically. This clamp is configured to release the device body at a predetermined position above the socket, and just before the testing probe enters the socket. In this way the socket test probe is guided in to fit with the socket by frictional forces between the socket test probe and the socket. In this way, the socket test probe, when unclamped and free floating, is free to move in two planes or to rotate in those planes in order to conform to the orientation of the socket.

The probe interface of the system can further include a first contact surface and a second contact surface. The first contact surface is located in the socket test probe holder. This first contact surface includes a printed circuit board which houses a plurality of spring probes. Each spring probe is contained in a spring probe receptacle. In relation to this invention, printed circuit board refers to the type of board on which circuits are typically printed for electronic circuits. In this application, however, only the board material is used, without circuits etched, layered or printed on the board material. The spring probes of the first contact surface extend out from the socket test probe holder, and are electrically connected to the testing system. The spring probes of the first contact surface come into contact with a second contact surface which is located on the socket test probe. This second contact surface also includes a section of printed circuit board. This printed circuit board of the second contact surface contains soldered knobs, which are electrically connected to electrodes of the socket test probe. They are arrayed in corresponding positions to the spring probes of the first contact surface, so that when the two are joined, electrical connection is complete between the electrodes of the socket test probe and the testing system. The probe interface further includes one or more alignment posts, which make it impossible to connect the socket test probe and the socket test probe holder in any but the correct configuration.

Some sockets are designed for a semiconductor chip to be pressed into position in the socket. Other sockets are designed so that zero insertion force is used to press a chip into place. Zero insertion force (ZIF) sockets are pressed along the rim of the socket to withdraw electrode clamps. With the rim depressed, the chip is pressed in place. When the rim is released, the electrode clamps are released, and grip the electrodes of the chip. To test a socket of this type, a zero insertion force collar is used on the device, such as the one shown in FIG. 9. The ZIF collar is mounted below the socket testing probe. The rim of the collar presses against the rim of the ZIF socket being tested, the electrode clamps are withdrawn, and a socket testing probe is inserted into place. When the ZIF collar is withdrawn, the electrode clamps grip the electrode of the socket testing probe just as they would a chip. The process is reversed when removing the socket test probe.

Another aspect of the invention is a method of positioning, aligning and inserting a socket testing probe into a socket. The method utilizes an X-Y table, in which X and Y are directions in a plane of the table. X and Y are normal to each other, and the Z direction is normal to the plane of the table. The method includes the steps of installing a socket test probe on to a positioning device body. The socket test probe is dimensioned and configured according to the dimensions and electrode configurations of a semiconductor chip for which the socket is designed. The positioning device body has a first contact surface with spring probes which matches a second contact surface of the socket test probe. The second contact surface of the socket test probe has soldered knobs, which are in corresponding positions with the spring probes of the socket test probe holder, and are electrically connected to the electrodes of the socket test probe. When the two are joined together, the spring probes of one contacts the soldered knobs of the other to complete a circuit. The device body is mounted to a ball joint which itself is contained in a ball joint housing. The ball joint housing allows the ball joint a limited freedom of movement when in a free floating mode. The device body can also be immobilized in an immobilized mode. The method further includes the steps of mounting the device body on an arm associated with the X-Y table. This arm may be motorized. The arm is capable of motion in a Z direction, that is, up and down in relation to the socket. The method further includes the step of mounting a printed circuit board containing one or more sockets on the X-Y table. The next step is moving the device in an X and Y direction until the first socket is positioned below the motorized arm of the X-Y table. The printed circuit board can contain one or a number of sockets. Next, the motorized arm of the X-Y table, with the device body in an immobilized mode, is lowered until the socket test probe is at a predetermined height above the socket. At that point, the device body is released from an immobilized mode to a free floating mode. The device body and socket test probe is then lowered into the socket in the free floating mode, so that the socket test probe can align itself with the socket by frictional forces between the socket and the socket test probe. Thus, the walls of the socket itself guide the socket test probe into position. The method continues by removing the device body and the socket test probe from this first socket tested after the required tests have been performed on the socket. Once removed from the socket, the device body is immobilized by the clamp. The device body is then raised above the X-Y table, and the device body is moved in the X and Y directions until the next socket to be tested is positioned below the arm of the X-Y table. This process is continued one socket at a time until all sockets on the printed circuit board are tested.

Still other objects and advantages of the present invention will become readily apparent to those skilled in this art from the following detailed description wherein I have shown and described only the preferred embodiment of the invention, simply by way of illustration of the best mode contemplated by carrying out my invention. As will be realized, the invention is capable of modification in various obvious respects all without departing from the invention. Accordingly, the drawing and description are to be regarded as illustrative in nature, and not as restrictive.

DESCRIPTION OF THE PREFERRED EMBODIMENTS

Figure 1:
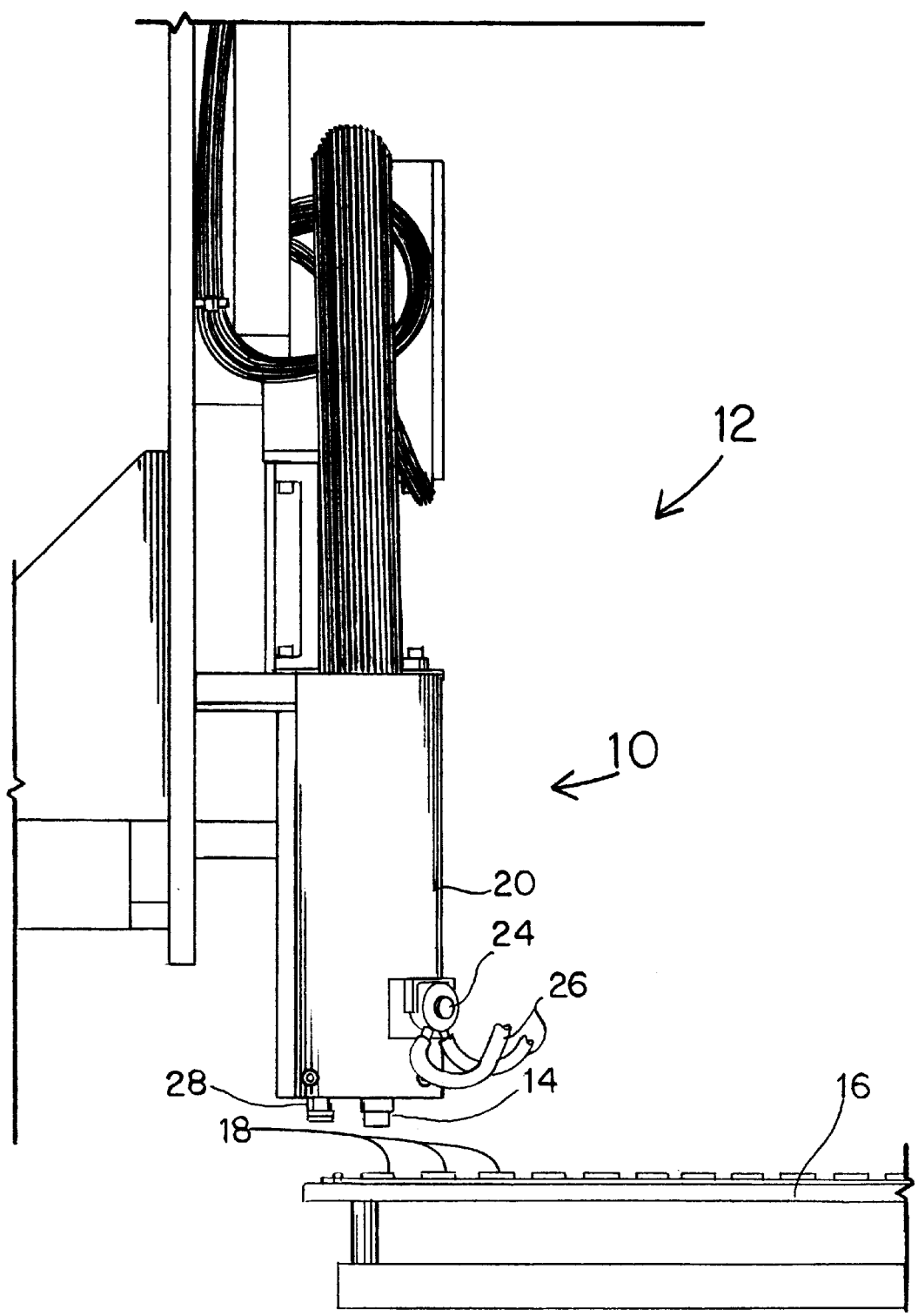
FIG. 1 is a side view of the socket test probe alignment system installed in an X-Y table.
Figure 2:
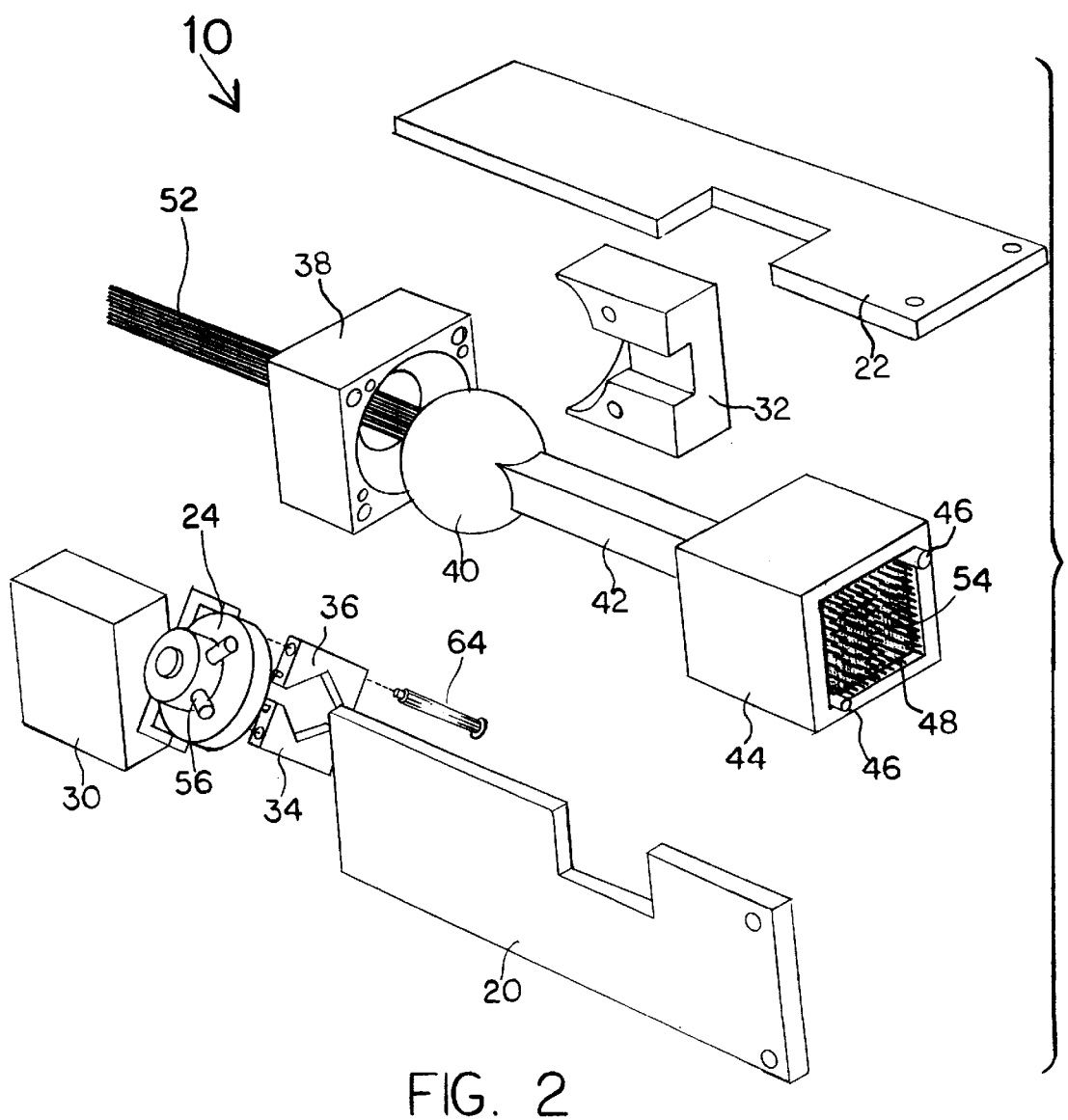
FIG. 2 is a perspective and exploded view showing the ball joint, the ball joint housing, device body, alignment pins, and the first surface of the probe interface.

The preferred embodiment of the invention is shown in the figures. FIG. 1 is a side view of the test probe positioning system in use with a prior art X-Y table. FIG. 2 is a perspective view of the positioning system disassembled for easier viewing. The test probe positioning system includes a generally spherical ball joint 40 which is attached to probe neck 42. The probe neck 42 in the preferred embodiment in square in cross-section. The probe neck 42 is attached to a probe head 44, which is generally rectangular in shape. Each of the ball joint 40, probe neck 42, and probe head 44 are hollow, and allow the passage of electrical connectors 52. The probe neck 42 and the probe head 44 together make up the probe body 50, also known as the positioning device body. At the end of the probe head 44 is a panel of printed circuit board 54. Mounted in the printed circuit board 54 are a number of spring probes 48. Spring probes 48 are prior art devices which are a probe with a number of contact head shapes mounted in a receptacle with a spring which forces the probe out. On either side of the printed circuit board 54, on the probe head 44, are alignment pins 46. These are of two different sizes or two different shapes, so that only one orientation will allow a socket test probe 14 to be attached to the probe head 44.

A socket test probe 14 is attached to the probe head using a unique interface configuration. On the probe head side of the interface, the interface configuration is a printed circuit board (PCB) with embedded prior art spring probes. The PCB forms a first contact surface of a socket test probe holder. The second contact surface is a PCB on the matching side of the socket test probe, which is provided with solder knobs in positions which correspond to the positions of the opposing spring probes. The solder knobs are electrically connected to electrodes in said socket test probe. This type of interface configuration provides a positive contact, positions for a large number of contacts, and flexibility to support a number of missions.

Figure 3:
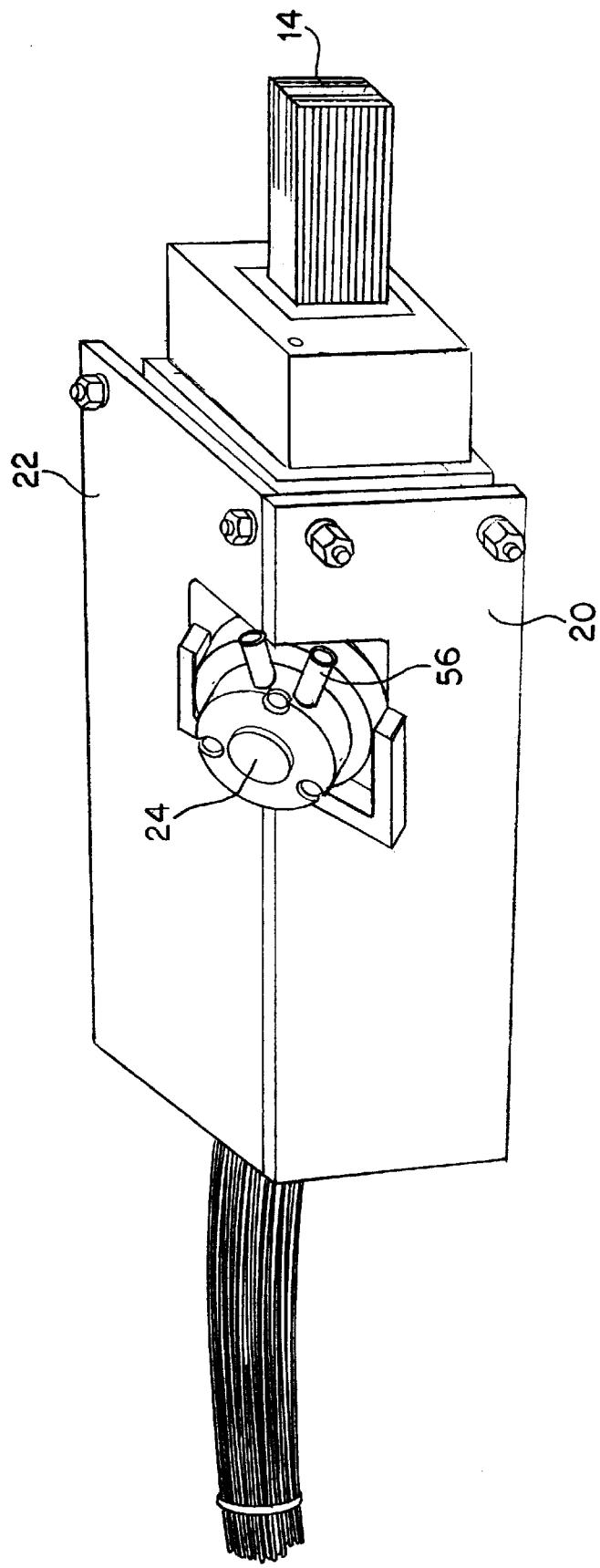
FIG. 3 is a perspective view of the assembled positioning device.

Also included in the alignment system is a top half ball joint housing 38. This is a generally rectangular block with semi-spherical hollow which matches the spherical shape of the top half of the ball joint 40. The alignment system also includes a left quarter ball joint housing 30 and a right quarter ball joint housing 32. When these two pieces are joined together, they form a hemispherical depression which cups the lower half of the ball joint 40. They also have a channel to allow the passage of the probe neck 42. Attached to the left quarter ball joint housing 30 is an air cylinder 24 with an accompanying probe clamp 34 and a clamp jaw 36. Affixed to the outside of the assembled probe head and the ball joint housings is a left side plate 20 and a right side plate 22. When these pieces are assembled, they are as shown in FIG. 3.

Figure 4:
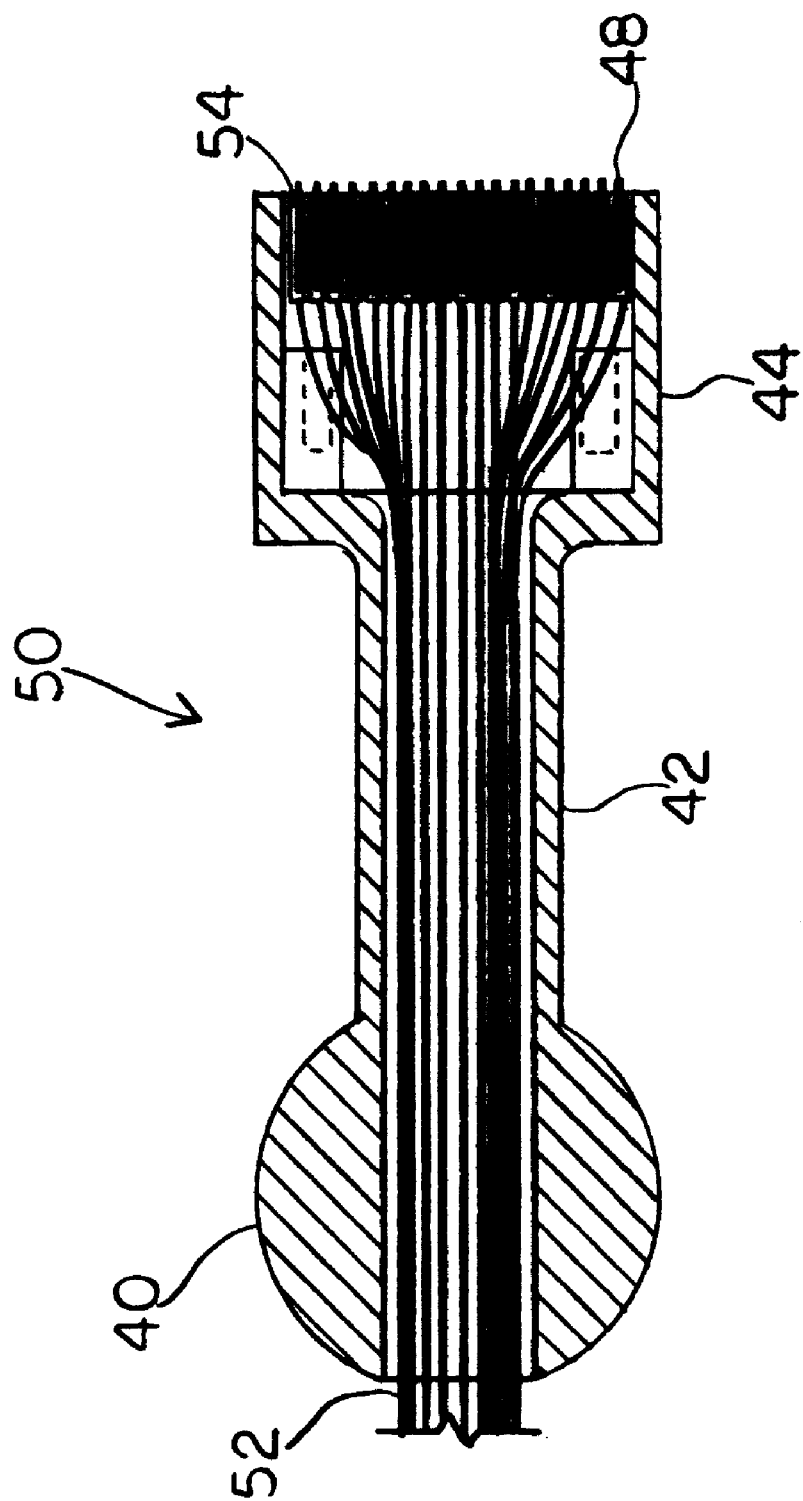
FIG. 4 is a side cross-sectional view of the ball joint and the first contact surface of the probe interface.
Figure 5:
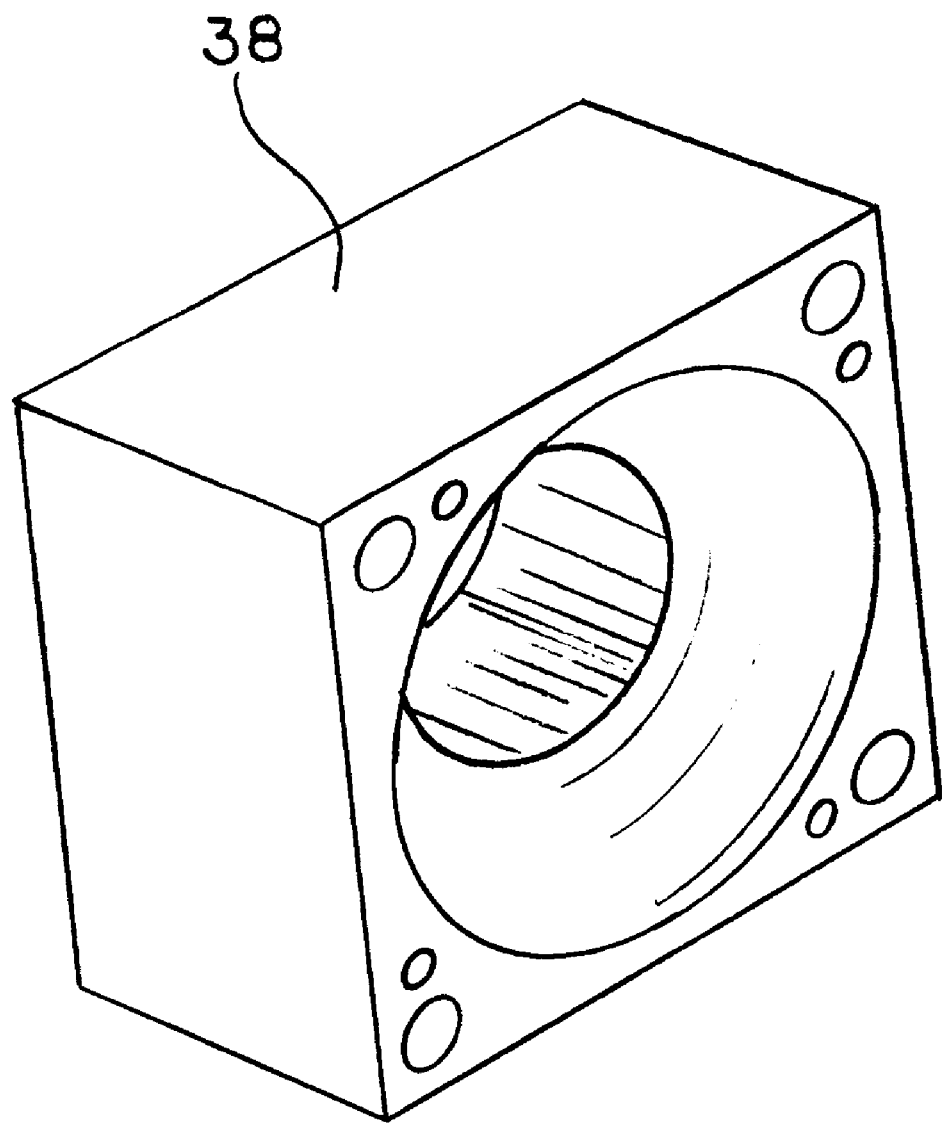
FIG. 5 is a perspective view of the top half section of the ball joint housing.
Figure 6:
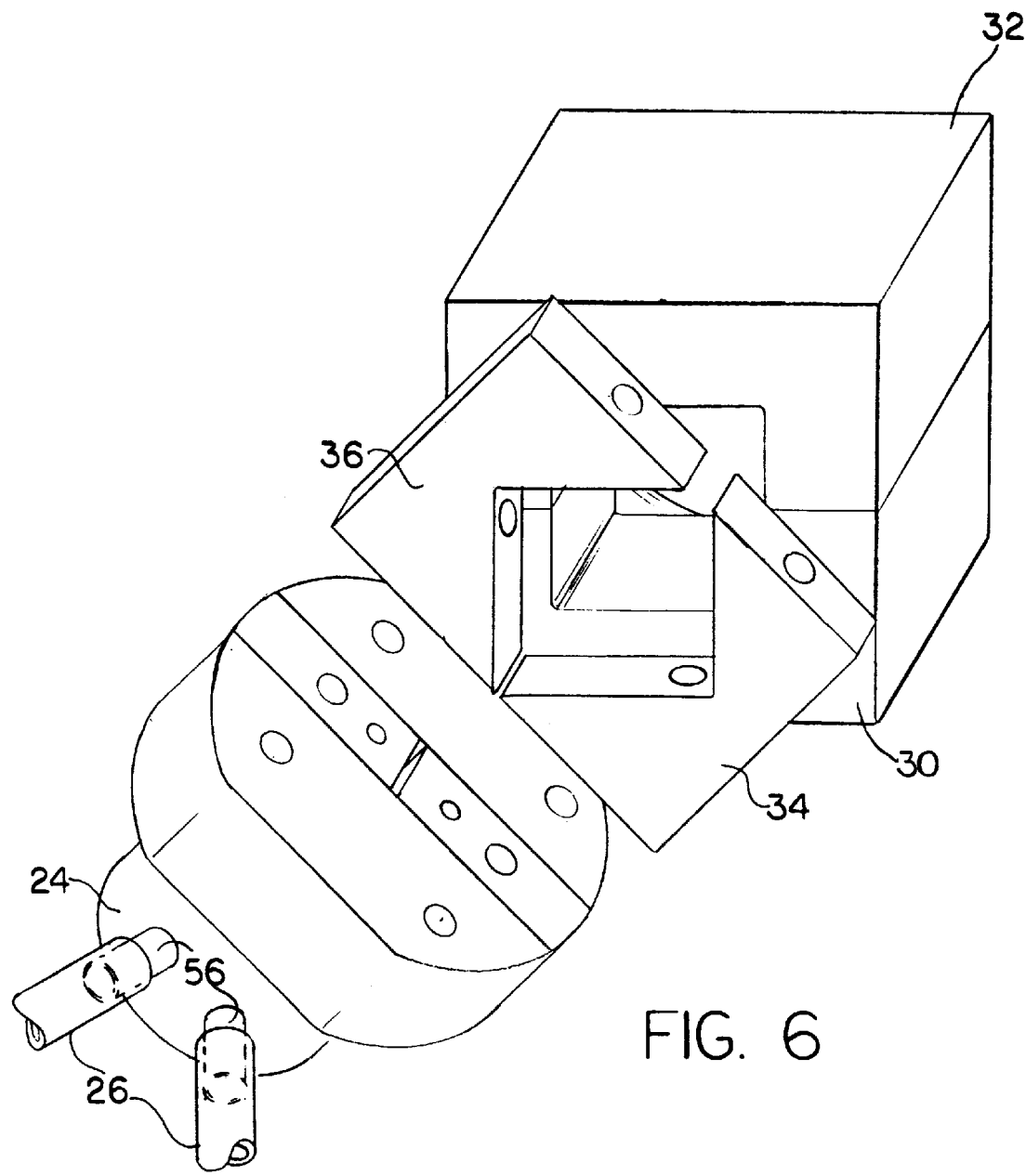
FIG. 6 is a perspective view of the lower left quarter section and the right quarter section of the ball joint housing, the clamp body, and clamp jaw.
Figure 7:
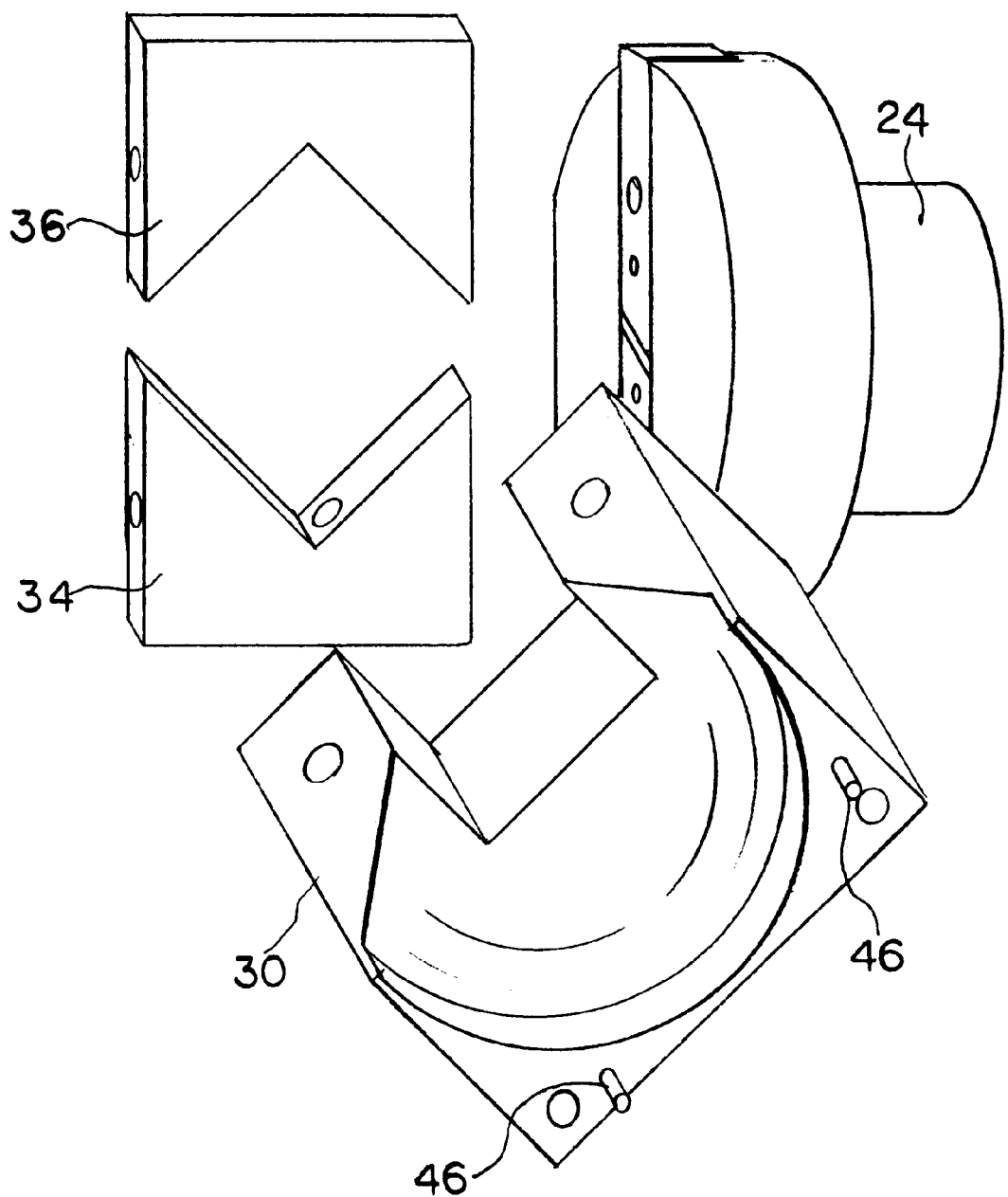
FIG. 7 is a perspective view of the lower left quarter section of the ball joint housing and the clamp body and clamp jaw.

A detailed view of the ball joint, and the electrical connectors 52 is shown in FIG. 4. Electrical connectors 52 pass through the ball joint, through the probe neck 42, and through the probe head 44, and connect to spring probes 48 which are mounted in printed circuit board 54. A more detailed view of the top half ball joint housing 38 is shown in FIG. 5. A view of the left quarter ball joint housing 30 and the right quarter ball joint housing 32 joined to the air cylinder 24, the probe head clamp 34 and the clamp jaw 36 is shown in FIGS. 6 and 7.

Figure 8:
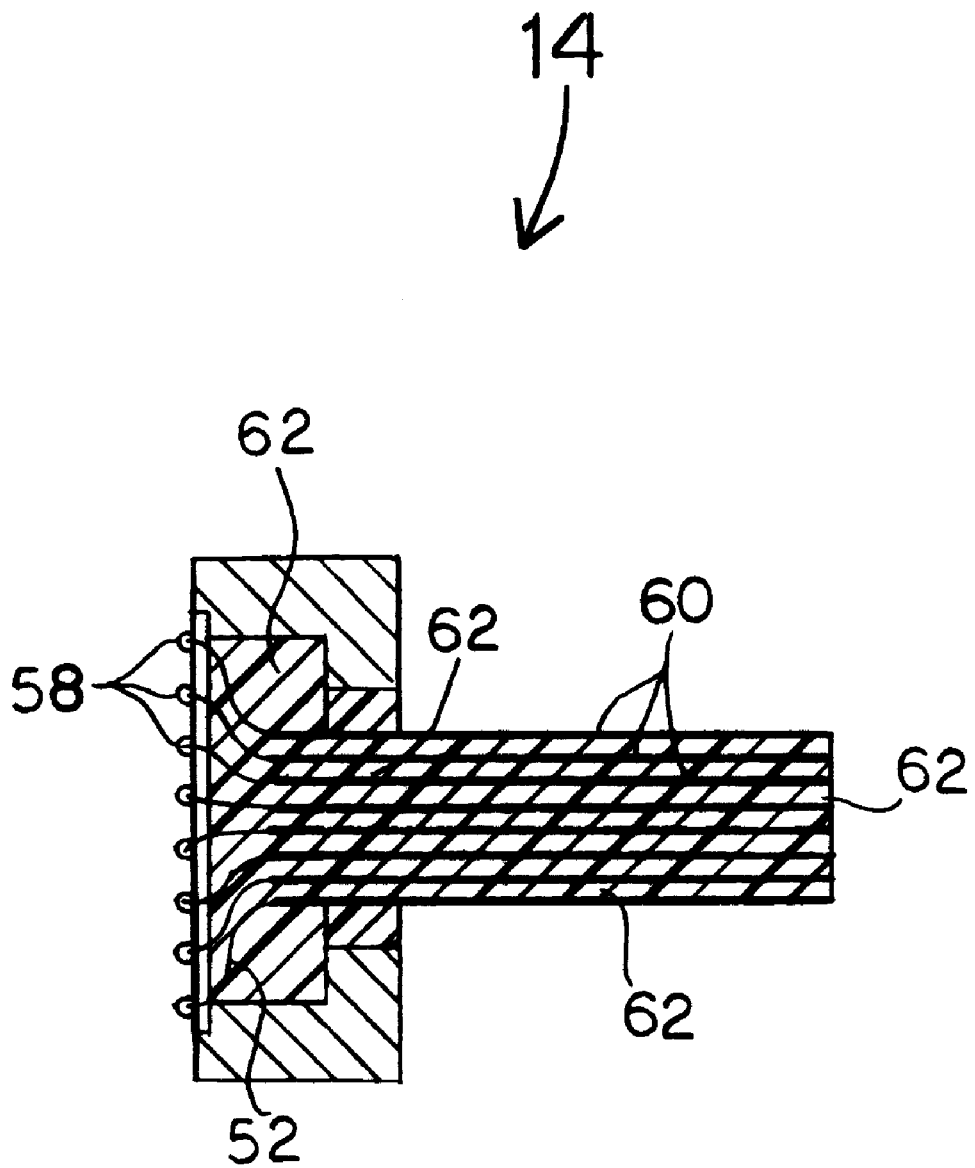
FIG. 8 is a side cross-sectional view of the socket testing probe.
Figure 9:
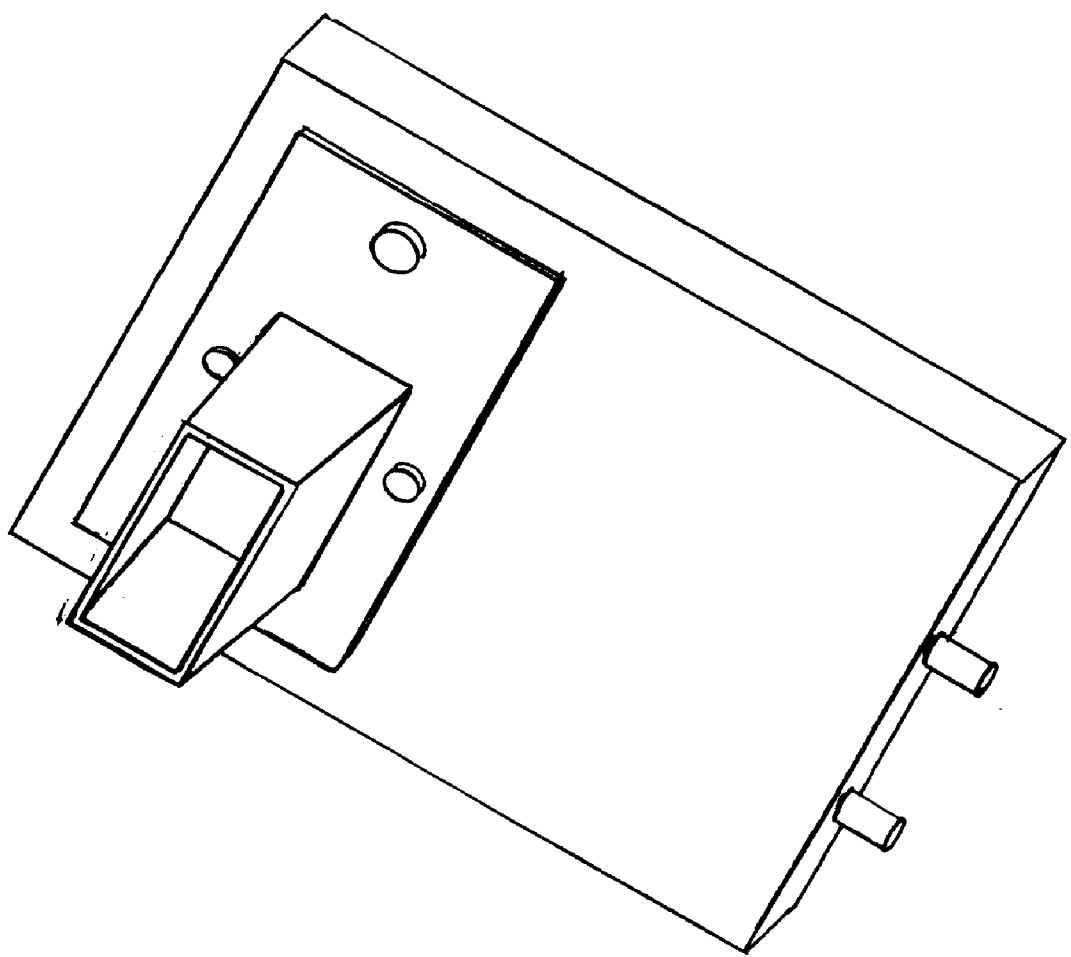
FIG. 9 is a perspective view of the zero insertion force collar.

A socket test probe 14 is shown in FIG. 8, and includes electrode plate 60, separated by resin layers 62, with electrical connectors 52, to solder knobs 58.

In use, the alignment system 10 is first assembled by connecting the top half ball joint housing 38 to the left quarter ball joint housing and the right quarter ball joint housing 32, to form a cube with the ball joint 40 enclosed in the spherical center of the cube. When the left quarter ball joint housing is connected around the ball joint 40, the probe head clamp 34 is fit around the probe neck 42 and the clamp jaw 36 is attached with a pin 64. Once these three pieces are tightened together with bolts, screws, or other fastening devices, then the left side plate 20 and the right side plate 22 are attached to the thus far assembled device. Each has a cut-out through which the air cylinder 24 and its associated air line tubes 56 extend, as is shown in FIG. 1 and also in FIG. 3. Next, a test probe 14 as shown in FIG. 8 is attached to the rest of the alignment system 10. FIG. 3 shows a test probe 14 attached to the rest of the system. This alignment system 10 is installed in an X-Y table 12, as shown in FIG. 1. Air line tubes 56 are connected by air lines 26 to an air source (not shown). In this configuration, the device body is moved into position over a sockets 18 to be tested on a printed circuit board 16. Although the preferred embodiment of the invention maintains the PCB stationary and moves the socket test probe to each socket, the invention could work equally well with a socket test probe which remained stationary in the X and Y directions, and in which the PCB was moved into position below the socket test probe.

The alignment system 10 and the socket test probe 14 moves in a third direction, normal to the printed circuit board, termed the Z direction, or up and down. The alignment system 10 and the attached socket test probe 14 move along a slide rail 28 of the X-Y table 12. When a socket 18 is in position below the socket test probe 14, as shown in FIG. 1, the alignment system 10 is lowered until the socket test probe is a predetermined height above the socket 18. This predetermined height could be 0.010 inches, or at another height selected by the operator of the system. While the printed circuit board 16 and the socket 18 are being moved into position below the socket test probe, air from the air lines 26 and the air cylinder 24 causes the clamp jaw 36 and the probe head clamp 34 to firmly grip the square shaft of the of the probe neck 42. When the socket test probe 14 is at the predetermined height above the socket 18, a change in air pressure through the air lines 26 and the air cylinder 24 causes the clamp jaw 36 and the probe head clamp 34 to release the probe neck 42. Once released, the alignment system is in a free floating mode and the ball joint 40 can freely rotate within the joint housing, allowing the probe head 44 and the attached socket test probe 14 a predetermined amount of freedom to move within the left side plate 20 and the right side plate 22. The degree of freedom allowed these components to move is set in the preferred mode by set screws in the left side plate 20 and the right side plate 22. These can be moved in or out to adjust the amount of X and Y direction motion that the socket test probe and its connected hardware can experience.

In the free floating mode, and from the predetermined height above the socket, the alignment system 10 with its attached socket test probe 14 is lowered into the socket. The socket may be perfectly aligned along the X-Y axis, or it may be slightly misaligned. It may not be perfectly within the plane of the X-Y axis, or it may be set askew in that plane in the X, Y or both axes, or rotated from position. With any of these deviations from the perfect position of the socket as the socket test probe 14 enters the socket 18, friction between the walls of the socket 18 and the sides of the socket test probe 14 causes the socket test probe 14 to rotate to accommodate the position of the socket 18. Socket test probe 14 is pressed into position in this free floating, self-positioning manner, until the socket test probe 14 is fully pressed into the socket 18. At that point, the diagnostic tests are run on the socket to test for conductivity and functioning. After socket 18 has been tested, the alignment system 10 is raised in a Z direction, and is moved into position over a new socket 18. As soon as the alignment system 10 is raised enough so that the socket test probe 14 clears the socket 18, then the head probe clamp 34 and clamp jaw 36 are reactivated on the probe neck 42. The alignment system 10 is thus held in a locked or immobilized position until it is ready to be released above the next socket to be tested. The probe head clamp 34 and the clamp jaw 36 thus form a clamp for immobilizing or allowing free movement to the probe body 50. The alignment system 10 is moved in a Z direction by a motorized arm which is commonly used in X-Y tables. Alternatively, a manual raising and lowering of the alignment system 10 is also possible. While there is shown and described the present preferred embodiment of the invention, it is to be distinctly understood that this invention is not limited thereto but may be variously embodied to practice within the scope of the following claims.

We claim:

1. A socket test probe positioning and inserting device, for inserting a socket test probe into a socket, and for connecting it electrically to a testing device, comprising:

a ball joint housing having a ball joint socket;

a ball joint, rotably contained within said ball joint socket;

a positioning device body, positioned within said ball joint housing and attached at one end to said ball joint and adapted at a second end to receive and hold a probe interface, said positioning device body being capable of rotational and arcuate movement about a center point;

a clamp for selectively immobilizing said positioning device body at a preselected position, and for releasing said positioning device body for rotational and arcuate movement before insertion of a socket test probe into a socket;

a socket test probe configured for physical and electrical interconnection with a probe interface;

a probe interface, for physically and electrically interconnecting said socket test probe to said positioning device body; and means for moving said positioning device body towards and away from a socket to be tested.

2. The device of claim 1 in which said clamp is activated and deactivated pneumatically.

3. A socket test probe positioning and inserting device, for inserting a socket test probe into a socket on the surface of a circuit board, and for connecting it electrically to a testing device, comprising:

a ball joint housing having a ball joint socket;

a ball joint, rotably contained within said ball joint socket;

a positioning device body, positioned within said ball joint housing and attached at one end to said ball joint and adapted at a second end to receive and hold a probe interface, said positioning device body being capable of rotational and arcuate movement about a center point;

a clamp for selectively immobilizing said positioning device body at a preselected position, and for releasing said positioning device body for rotational and arcuate movement before insertion of a socket test probe into a socket;

a socket test probe having a plurality of electrodes configured for physical and electrical interconnection between said socket and a probe interface;

a probe interface, having means for physically interconnecting said socket test probe to said positioning of device body and electrically interconnecting said socket test probe with said testing device; and means for moving said positioning device body towards and away from said circuit board for insertion and withdrawal of said socket test probe into and out from said socket to be tested.

4. The device of claim 3 in which said ball joint housing having a ball joint socket further comprises a plurality of sections, which join together to form said ball joint socket.

5. The device of claim 4 which further comprises three ball joint housing pieces, an upper half piece, and two lower quarter pieces which together form a lower half piece.

6. The device of claim 3 in which said clamp is configured to release said positioning device body just above the socket and before said socket test probe enters said socket, so that said socket test probe may be guided into insertion into said socket by frictional forces between said socket test probe and said socket.

7. The device of claim 3 wherein said means for electrically interconnecting said socket test probe with said testing device further comprises:

a circuit board which houses a plurality of spring probes each electrically interconnected with said testing device; and a second contact surface attached to said socket test probe, said second contact surface having a plurality of solder knobs, each electrically connected to electrodes in said socket test probe, and each arrayed in corresponding positions to said spring probes for electrical interconnection with said spring probes.

8. An interface configuration for connecting a socket test probe, having electrodes for testing a socket, to a socket testing system, comprising:

a first contact surface located in said socket testing system, which includes a circuit board which houses a plurality of spring probes; and a second contact surface attached to said socket test probe, said second contact surface having a plurality of solder knobs, each electrically connected to electrodes in said socket test probe, and each arrayed in corresponding positions to said spring probes for electrical interconnection with said spring probes.

9. A method of positioning, aligning and inserting a socket testing probe into a socket to be tested, using an X-Y registration table having X and Y axis are normal to each other and define a plane of said table, and a Z axis normal to said plane of said table, comprising the steps of:

installing a socket test probe, which is dimensioned and configured according to the dimensions and electrode configurations of a semiconductor chip for which said socket is designed to receive, on a socket test probe holder;

mounting said socket test probe holder on a positioning device body, which is mounted to a ball joint, which is contained in a ball joint housing which allows said ball joint, positioning device body and socket test probe holder, limited freedom of movement when in a free floating mode, and in which said body can be immobilized in an immobilized mode;

mounting said positioning device body on a movable arm of said X-Y registration table which is capable of motion in along said Z axis;

mounting a printed circuit board containing one or more sockets on said X-Y registration table;

moving said printed circuit board in X and Y directions until a first of said sockets is positioned below said motorized arm of said X-Y registration table;

lowering said motorized arm of said X-Y table with said device body in an immobilized mode until said socket test probe is a predetermined height above said socket;

releasing said device body from an immobilized mode to a free floating mode;

lowering said device body and said socket test probe into said socket in a free floating mode, so that said socket test probe aligns itself with said socket by frictional forces between said socket and said socket test probe;

removing said device body and said socket test probe from said socket after tests have been performed on said socket; and switching said device body to an immobilized mode.

* * * * *